(12) United States Patent
Nam et al.

(10) Patent No.: US 9,389,500 B2
(45) Date of Patent: Jul. 12, 2016

(54) MASK BLANK, PHOTOMASK, AND METHOD FOR MANUFACTURING SAME

(71) Applicant: S&S Tech Co., Ltd., Daegu-si (KR)

(72) Inventors: Kee-Soo Nam, Daegu-si (KR); Geung-Won Kang, Daegu-si (KR); Jong-Hwa Lee, Daegu-si (KR); Chul-Kyu Yang, Daegu-si (KR); Soon-Gi Kwon, Daegu-si (KR)

(73) Assignee: S&S Tech Co., Ltd., Daegu-si (KR)

( * ) Notice: Subject to any disclaimer, the term of this patent is extended or adjusted under 35 U.S.C. 154(b) by 0 days.

(21) Appl. No.: 14/377,941

(22) PCT Filed: Oct. 26, 2012

(86) PCT No.: PCT/KR2012/008852
§ 371 (c)(1),
(2) Date: Aug. 11, 2014

(87) PCT Pub. No.: WO2013/172515
PCT Pub. Date: Nov. 21, 2013

(65) Prior Publication Data
US 2015/0212403 A1    Jul. 30, 2015

(30) Foreign Application Priority Data

May 14, 2012   (KR) .................. 10-2012-0050634
Oct. 17, 2012   (KR) .................. 10-2012-0115190

(51) Int. Cl.
*G03F 1/26*        (2012.01)
*G03F 1/76*        (2012.01)
*G03F 1/80*        (2012.01)
*G03F 1/50*        (2012.01)

(52) U.S. Cl.
CPC .. *G03F 1/26* (2013.01); *G03F 1/50* (2013.01); *G03F 1/76* (2013.01); *G03F 1/80* (2013.01)

(58) Field of Classification Search
CPC ............... G03F 1/26; G03F 1/30; G03F 1/32; G03F 1/50; G03F 1/76; G03F 1/80
USPC .................................................. 430/5
See application file for complete search history.

(56) References Cited

U.S. PATENT DOCUMENTS

| | | | |
|---|---|---|---|
| 7,371,484 B2 * | 5/2008 | Lee | ............ G03F 1/26 430/5 |
| 2009/0325084 A1 | 12/2009 | Hashimoto et al. | |

FOREIGN PATENT DOCUMENTS

| | | |
|---|---|---|
| EP | 1439418 A2 | 7/2004 |
| EP | 1847874 A2 | 10/2007 |
| JP | 09050112 A | 2/1997 |
| JP | 2002107911 A | 4/2002 |
| JP | 2009063638 A | 3/2009 |
| JP | 2012073326 A | 4/2012 |
| KR | 1019980026623 A | 7/1998 |
| KR | 100278645 B1 | 10/2000 |
| KR | 1020050019210 A | 3/2005 |
| KR | 1020100002162 A | 1/2010 |
| KR | 1020110001909 A | 1/2011 |
| KR | 1020110093551 A | 8/2011 |
| TW | 201124794 A1 | 7/2011 |

* cited by examiner

*Primary Examiner* — Christopher Young
(74) *Attorney, Agent, or Firm* — William Park & Associates Ltd.

(57) ABSTRACT

Provided are a method of manufacturing a photomask, in which a hardmask film pattern is used as an etch mask for etching a phase-shift layer under the hardmask film pattern, a blankmask, and a photomask using the blankmask. In the method, a resist film for patterning a hardmask film may be formed to a thin thickness, and the phase-shift layer may be etched using the hardmask film pattern having a high etch selectivity with respect to the phase-shift layer. Accordingly, an optical density may be maintained to be 3.0 due to use of a light-shielding film pattern, thereby increasing the resolution and precision of a pattern, reducing a loading effect, and improving critical dimension (CD) features, such as CD uniformity and CD linearity.

13 Claims, 6 Drawing Sheets

MASK BLANK, PHOTOMASK, AND METHOD FOR MANUFACTURING SAME

TECHNICAL FIELD

The present invention relates to a blankmask, a photomask, and a method of fabricating the photomask, and more particularly, to a blankmask that can be used to form a high-precision minimum critical dimension (CD) during a semiconductor photolithography process and that thus can be applied in the field of 193 nm ArF lithography and immersion lithography capable of transferring a high-resolution pattern, e.g., a pattern of 45 nm, and particularly, a pattern or 32 nm or less, a photomask, and a method of fabricating the photomask.

BACKGROUND ART

Today, as high integration of large-scale integrated circuits (ICs) has been accompanied by a need for a fine circuit pattern, semiconductor microfabrication process technology has emerged as a very important issue. In the case of a highly integrated circuit, circuit wires become finer for low power consumption and high-speed operations, and there is a growing need for a contact hole pattern for an interlayer connection and a circuit arrangement for high integration. Thus, in order to satisfy such demands, a photomask on which an original circuit pattern is recorded needs to be manufactured to be finer and to be capable of recording a more precise circuit pattern thereon.

A photolithography technology has been developed to shorten an exposure wavelength by using a 436 nm g-line, a 365 nm i-line, 248 nm KrF laser, or 193 nm ArF laser in order to improve the resolution of a semiconductor circuit pattern. However, the shortening of the exposure wavelength greatly contributes to an improvement on the resolution of a semiconductor circuit pattern but deteriorates a depth of focus (DoF), thereby increasing a burden on design of an optical system including a lens. Accordingly, in order to solve this problem, a phase-shift mask has been developed to improve both the resolution and DoF of a semiconductor circuit pattern using a phase-shift layer that shifts the phase of exposure light by 180 degrees.

A conventional phase-shift mask is manufactured by sequentially forming a light-shielding film and a resist film pattern on a phase-shift layer, forming a light-shielding film pattern by etching the light-shielding film using the resist film pattern as an etch mask, and etching the phase-shift layer using the light-shielding film pattern as an etch mask. The light-shielding film should have a predetermined optical density so as to effectively block light. To this end, the light-shielding film may be formed to a thickness of about 600 or more. In this case, a resist film may be formed to a thickness of about 2,000 or more so as to etch the light-shielding film, based on the thickness of the light-shielding film.

Recently, as patterns have become finer and higher denser, for example, to have a size of 45 nm or less, and particularly, 32 nm or less, a photomask is required to be manufactured to have not only a high resolution but also precise critical dimension (CD) mean-to-target (MTT), CD uniformity, and CD linearity.

However, since a conventional phase-shift mask uses a resist film having a thickness of about 2,000 or more, a fine resist film pattern is difficult to form. Thus, it is difficult to form a fine light-shielding film pattern that is used as an etch mask for etching a phase-shift layer, thereby preventing manufacture of a fine phase-shift layer pattern.

Accordingly, there is a growing need to develop a new blankmask, the optical density of which can be maintained at about 2.0 to 4.0, and that allows a resist film to be formed to a thin thickness, thereby improving CD characteristics.

DISCLOSURE

Technical Problem

The present invention is directed to a blankmask, the optical density of which is maintained at about 2.0 to 4.0 and that has improved critical dimension (CD) features, such as a high resolution, precision, CD mean-to-target (MTT), CD uniformity, and CD linearity, thereby enabling transfer of a high-resolution pattern, e.g., a pattern of 45 nm, and particularly, a pattern of 32 nm or less; a photomask using the blankmask; and a method of fabricating the photomask.

Technical Solution

According to an aspect of the present invention, there is provided a blankmask including a transparent substrate, a phase-shift layer formed on the transparent substrate, and a hardmask film formed on the phase-shift layer.

The phase-shift layer may have a transmissivity of 0.1% to 40% at an exposure wavelength of 200 nm or less. The phase-shift layer may have a phase reversal of 170° to 190° at an exposure wavelength of 200 nm or less. The phase-shift layer may have a thickness of 100 to 1,000. The phase-shift layer may include silicon (Si), and at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W). Optionally, the phase-shift layer may include at least one material selected from the group consisting of nitrogen (N), oxygen (O), and carbon (C).

The hardmask film may have a thickness of 10 to 100. Each of the phase-shift layer and the hardmask film may have a single or multi-layer form, and may be formed in either a single layer, the composition of which is uniform in a depthwise direction thereof or in a continuous layer, the composition of which varies in the depthwise direction.

The blankmask may further include a resist film formed on the hardmask film. The resist film may have a thickness of 300 to 2,000. The resist film may be formed of a material containing an acid.

The blankmask may further include a light-shielding film pattern formed on an upper or lower surface of the transparent substrate or a light-shielding film formed on the lower surface of the transparent substrate, so that edge regions of the transparent substrate may be defined as blind areas.

The blind areas each may have an optical density of 2.0 to 4.0 at an exposure wavelength. The light-shielding film pattern or the light-shielding film may have a single or multi-layer form, and may be formed in either a single layer, the composition of which is uniform in a depthwise direction thereof or in a continuous layer, the composition of which varies in the depthwise direction. The light-shielding film pattern or the light-shielding film may have a thickness of 200 to 1,500. The blankmask may further include an anti-reflective film pattern formed on the light-shielding film pattern, or an anti-reflective film formed on the light-shielding film.

At least one of the light-shielding film pattern, the light-shielding film, and the hardmask film may include at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), tungsten (W), and silicon (Si), and may optionally include at least one material selected from the group consisting of nitrogen (N), oxygen (O), and carbon (C).

According to another aspect of the present invention, there is provided a photomask manufactured using a blankmask according to the present invention, in which a transparent substrate is defined to include blind areas each including light-shielding regions and a light-transmitting region and a main area including phase-shift regions and light-transmitting regions. The light-transmitting regions are regions via which the transparent substrate is exposed. The phase-shift regions are regions in which a phase-shift layer pattern is formed in the main area of the transparent substrate. The light-shielding regions are regions in which a light-shielding film pattern is formed in the blind areas of the transparent substrate. The light-shielding film pattern has a thickness of 200 to 1,500 so that the light-shielding regions each have an optical density of 2.0 to 4.0 with respect to exposure light.

Each of the light-shielding regions may include a light-shielding film pattern and a phase-shift layer pattern that are sequentially formed on the transparent substrate, a phase-shift layer pattern and a light-shielding film pattern that are sequentially formed on the transparent substrate, or a light-shielding film pattern formed on a lower surface of the transparent substrate and a phase-shift layer pattern formed on an upper surface of the transparent substrate.

The photomask may further include an anti-reflective film pattern formed on the light-shielding film pattern. The photomask may further include a hardmask film pattern formed on the phase-shift layer pattern.

According to another aspect of the present invention, there is provided a method of manufacturing a photomask including a transparent substrate including blind areas each including light-shielding regions and a light-transmitting region and a main area including phase-shift regions and light-transmitting regions, the method including (a) forming a light-shielding film pattern at locations corresponding to the light-shielding regions on an upper or lower surface of the transparent substrate; (b) forming a phase-shift layer on the transparent substrate; (c) forming a hardmask film on the phase-shift layer; (d) forming a resist film pattern for pattering the hardmask film on the hardmask film to expose portions of the hardmask film corresponding to the light-transmitting regions; (e) forming a hardmask film pattern by etching the exposed portions of the hardmask film using the resist film pattern for patterning the hardmask film as an etch mask; and (f) forming a phase-shift layer pattern in the phase-shift regions by etching exposed portions of the phase-shift layer using the hardmask film pattern as an etch mask.

(b) may be performed first, after which (a), (c), (d), (e), and (f) may be sequentially performed. (b), (c), (d), (e), and (f) may first be performed sequentially, after which (a) may be performed. During the performing of (a), patterning or a lift-off method using a resist film may be used. The method may further include removing the hardmask film pattern after the performing of (f).

Advantageous Effects

The present invention, the hardmask film is formed on the phase-shift layer. Thus, during a subsequent process of manufacturing a photomask, the hardmask film may be used as an etch mask to pattern an underlying film having an etch selectivity with respect to the hardmask film, i.e., the phase-shift layer.

Thus, the resist film for patterning the hardmask film may be formed to a thin thickness, thereby reducing a loading effect. Thus, CD characteristics, e.g., resolution, precision, CD MTT, CD uniformity, and CD linearity, of a photomask manufactured using such a blankmask, may be improved, thereby enabling a minimum CD of 45 nm, and particularly, 32 nm or less. Accordingly, the photomask may be applied to 193 nm ArF lithography, immersion lithography, and the like.

MODE FOR INVENTION

Figure 1:
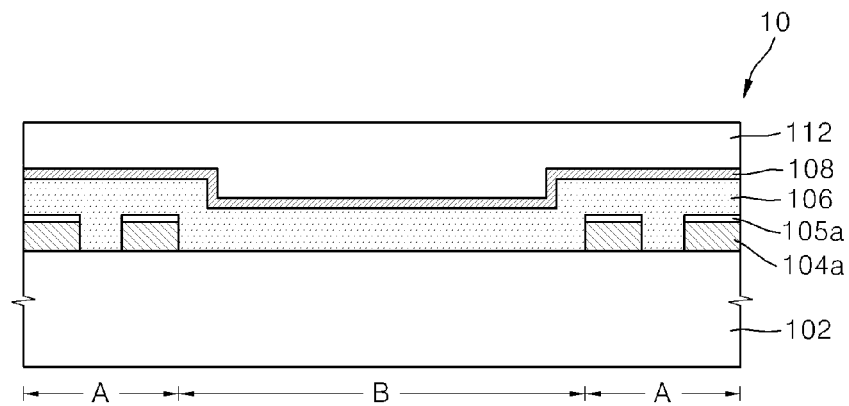
FIGS. 1 to 4 are cross-sectional views of blankmasks according to various embodiments of the present invention.

Exemplary embodiments of the present invention will now be described more fully with reference to the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those of ordinary skill in the art. In the drawings, the thicknesses and shapes of layers and regions may be exaggerated for clarity. The same reference numerals represent the same elements throughout the drawings. It will be understood that when an element or layer is referred to as being "on," "above," or "under" another element or layer, the element or layer can be directly on another element or layer or intervening elements or layers may be present.

FIG. 1 is a cross-sectional view of a blankmask 10 according to a first embodiment of the present invention. Referring to FIG. 1, the blankmask 10 according to the first embodiment includes a light-shielding film pattern 104a formed on a transparent substrate 102 so that edge regions of the transparent substrate 102 may be defined as blind areas A. In the blankmask 10, a main area B surrounded by the blind areas A is also defined.

The blankmask 10 further includes a phase-shift layer 106 formed on the transparent substrate 102 to cover the light-shielding film pattern 104a, and a hardmask film 108 formed on the phase-shift layer 106. A resist film 112 for patterning the hardmask film 108 may be formed on the hardmask film 108

Figure 2:
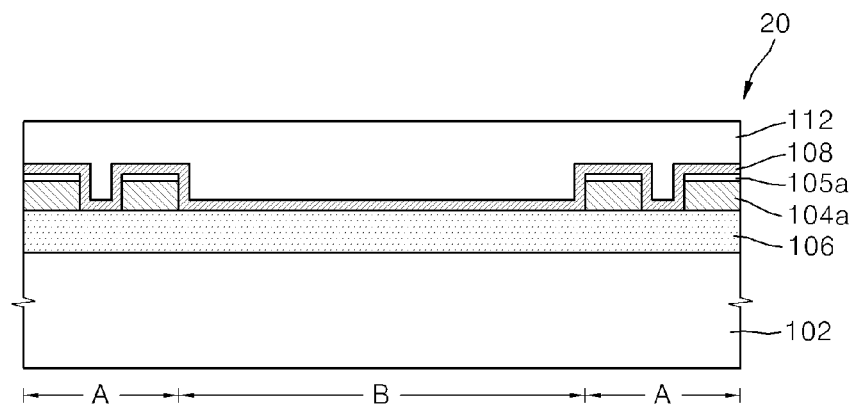

FIG. 2 is a cross-sectional view of a blankmask 20 according to a second embodiment of the present invention. Referring to FIG. 2, the blankmask 20 according to the second embodiment includes a phase-shift layer 106 formed on a transparent substrate 102. The blankmask 20 further includes a light-shielding film pattern 104a on the transparent substrate 102 so that edge regions of the transparent substrate 102 may be defined as blind areas A. In the blankmask 20, a main area B surrounded by the blind areas A is also defined.

The blankmask 20 further includes a hardmask film 108 formed on the light-shielding film pattern 104a and the phase-shift layer 106. A resist film 112 for patterning the hardmask film 108 may be formed on the hardmask film 108.

The phase-shift layer 106 is formed on the light-shielding film pattern 104a in the case of the blankmask 10 according to the first embodiment, whereas the light-shielding film pattern 104a is formed on the phase-shift layer 106 in the case of the blankmask 20 according to the second embodiment. That is, an order in which the light-shielding film pattern 104a and the phase-shift layer 106 are formed may be different in the blankmasks 10 and 20.

In the blankmasks 10 and 20, the blind areas A each have an optical density of 2.0 to 4.0 at an exposure wavelength. As illustrated in FIGS. 1 and 2, an anti-reflective film pattern 105a may further be formed on the light-shielding film pattern 104a.

Figure 3:
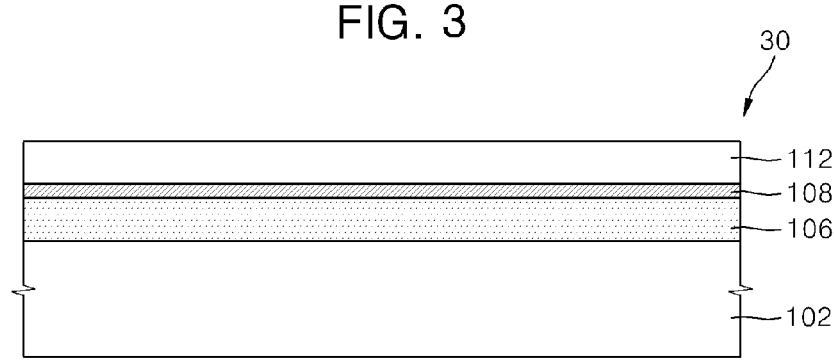

FIG. 3 is a cross-sectional view of a blankmask 30 according to a third embodiment of the present invention. Referring to FIG. 3, the blankmask 30 according to the third embodiment includes a transparent substrate 102, a phase-shift layer 106 formed on the transparent substrate 102, and a hardmask film 108 formed on the phase-shift layer 106. A resist film 112 for patterning the hardmask film 108 may be formed on the hardmask film 108.

Figure 4:
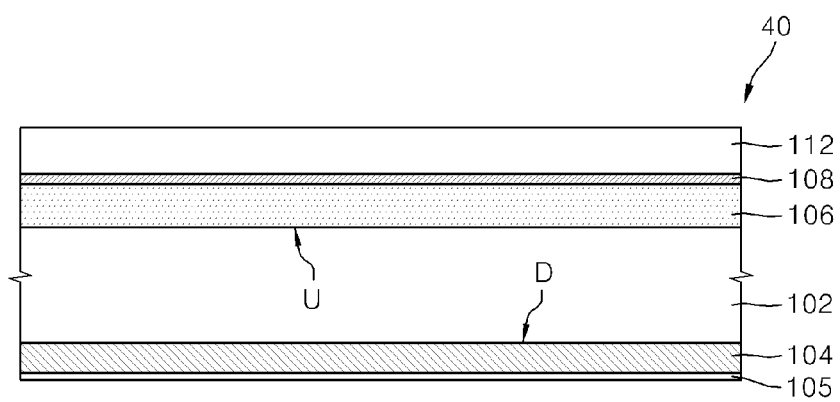

FIG. 4 is a cross-sectional view of a blankmask 40 according to a fourth embodiment of the present invention. Referring to FIG. 4, the blankmask 40 according to the fourth embodiment includes a transparent substrate 102; a phase-shift layer 106 formed on the transparent substrate 102 and particularly, on an upper surface U of the transparent substrate 102; a hardmask film 108 formed on the phase-shift layer 106; and a light-shielding film 104 formed under the transparent substrate 102, and particularly, on a lower surface D of the transparent substrate 102. A resist film 112 for patterning the hardmask film 108 may be formed on the hardmask film 108. An anti-reflective film 105 may be formed on the light-shielding film 104.

Although not shown, a modified example of the blankmask 40, in which the phase-shift layer 106 is patterned, the hardmask film 108 and the resist film 112 for patterning the hardmask film 108 are removed, and a resist film for patterning the light-shielding film 104 is further formed on the light-shielding film 104, may be another embodiment of the present invention. Although not shown, another modified example of the blankmask 40, in which the light-shielding film 104 is patterned to form the light-shielding film pattern 104a under the transparent substrate 102, thereby defining the edge regions of the transparent substrate 102 as the blind areas A, may also be another embodiment of the present invention.

In the blankmasks 10, 20, 30 and 40 of FIGS. 1 to 4, each of the light-shielding film 104, the light-shielding film pattern 104a, the phase-shift layer 106, and the hardmask film 108 has a single or multi-layer form, and is formed in a single layer, the composition of which is uniform in a depthwise direction (a direction toward the transparent substrate 102) or in a continuous layer, the composition of which varies in the depthwise direction. The light-shielding film 104 and the light-shielding film pattern 104a each have a thickness of 200 to 1,500.

The phase-shift layer 106 has a transmissivity of 0.1% to 40% at an exposure wavelength of 200 nm or less, has a phase reversal of 170° to 190°, and has a thickness of 100 to 1,000. The phase-shift layer 106 includes silicon (Si), and further includes at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), tungsten (W), and silicon (Si). Optionally, the phase-shift layer 106 may further include at least one material selected from the group consisting of nitrogen (N), oxygen (O), and carbon (C).

The hardmask film 108 has a thickness of 10 to 100.

At least one among the light-shielding film 104, the light-shielding film pattern 104a, and the hardmask film 108 includes at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), tungsten (W), and silicon (Si). Optionally, at least one among the light-shielding film 104, the light-shielding film pattern 104a, and the hardmask film 108 may further include at least one material selected from the group consisting of nitrogen (N), oxygen (O), and carbon (C).

The resist film 112 for patterning the hardmask film 108 has a thickness of 300 to 2,000, and includes a material containing an acid.

In the blankmasks 10, 20, 30, and 40 according to various embodiments of the present invention, the hardmask film 108 is formed on the phase-shift layer 106. Thus, during a subsequent process of manufacturing a photomask, the hardmask film 108 may be used as an etch mask to pattern an underlying film having an etch selectivity with respect to the hardmask film 108, i.e., the phase-shift layer 106. Thus, the resist film 112 for patterning the hardmask film 108 may be formed to a thin thickness, thereby reducing a loading effect. Thus, CD characteristics, e.g., resolution, precision, CD MTT, CD uniformity, and CD linearity, of a photomask manufactured using such a blankmask, may be improved, thereby enabling a minimum CD of 45 nm, and particularly, 32 nm or less. Accordingly, the photomask may be applied to 193 nm ArF lithography, immersion lithography, and the like.

Figure 5:
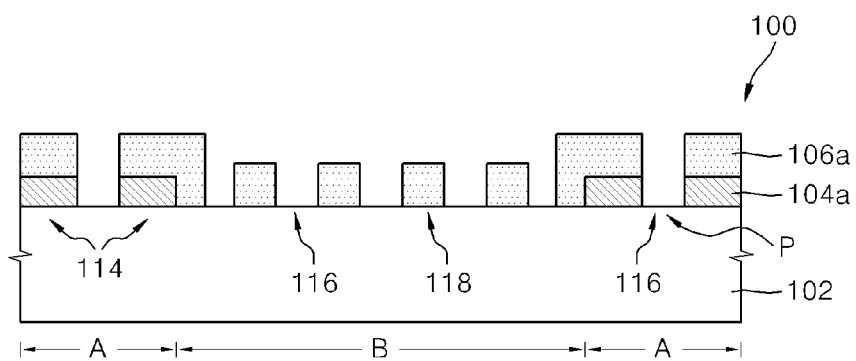
FIGS. 5 to 7 are cross-sectional views of photomasks according to various embodiments of the present invention.

FIG. 5 is a cross-sectional view of a photomask 100 according to a fifth embodiment of the present invention.

Referring to FIG. 5, the photomask 100 according to the fifth embodiment includes blind areas A including auxiliary patterns, such as alignment keys P, and a main area B including main patterns. The blind areas A each include light-shielding regions 114 and a light-transmitting region 116. The main area B includes light-transmitting regions 116 and phase-shift regions 118.

The light-transmitting regions 116 included in the blind areas A and the main area B are regions via which the transparent substrate 102 is exposed, and the phase-shift regions 118 are regions in which a phase-shift layer pattern 106a is formed on a transparent substrate 102. The light-shielding regions 114 of the blind areas A are regions in which a light-shielding film pattern 104a is formed on the transparent substrate 102. In particular, in the present embodiment, the light-shielding film pattern 104a and the phase-shift layer pattern 106a are sequentially formed to obtain the light-shielding regions 114.

The photomask 100 may be manufactured by using the blankmask 10 described above with reference to FIG. 1 as a starting material and patterning the phase-shift layer 106. A method of manufacturing the photomask 100 will be described in greater detail below. When the photomask 100 is manufactured using the blankmask 10, the photomask 100 may further include the anti-reflective film pattern 105a of FIG. 1 formed on the light-shielding film pattern 104a, and a hardmask film pattern (not shown) on the phase-shift layer pattern 106a.

Figure 6:
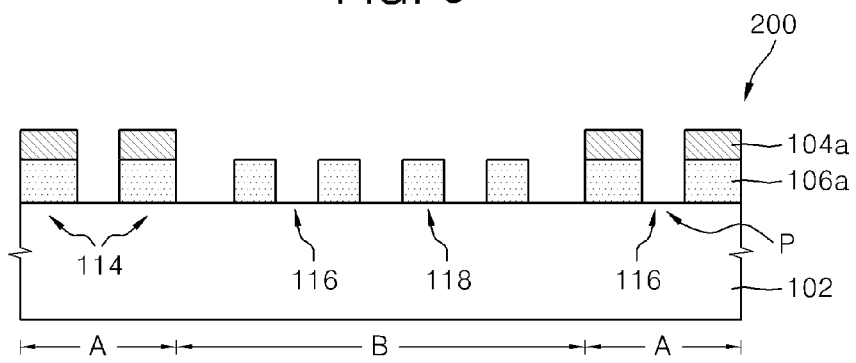

FIG. 6 is a cross-sectional view of a photomask 200 according to a sixth embodiment of the present invention.

Referring to FIG. 6, the photomask 200 according to the sixth embodiment is the same as the photomask 100 of FIG. 5, except that a phase-shift layer pattern 106a and a light-shielding film pattern 104a are sequentially formed on a transparent substrate 102 to form light-shielding regions 114. The photomask 200 may be manufactured by using the blankmask 20 described above with reference to FIG. 2 and patterning a phase-shift layer 106 or may be manufactured by using the blankmask 30 described above with reference to FIG. 3, patterning the phase-shift layer 106, and further forming a light-shielding film pattern 104a on the patterned phase-shift layer 106. A method of manufacturing the photomask 200 will be described in greater detail below.

Figure 7:
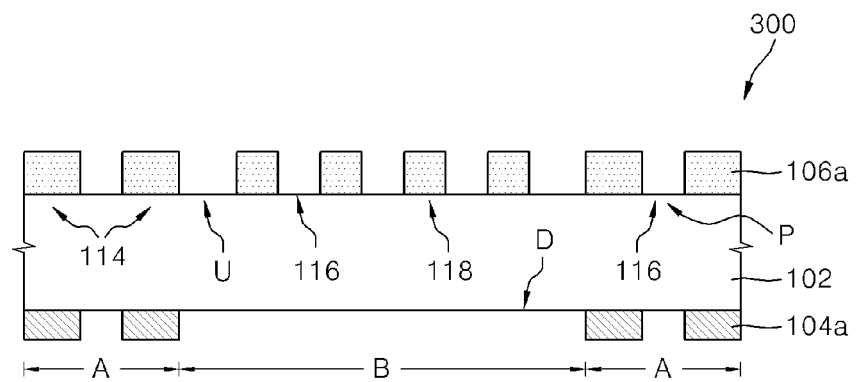

FIG. 7 is a cross-sectional view of a photomask 300 according to a seventh embodiment of the present invention.

Referring to FIG. 7, the photomask 300 according to the seventh embodiment is the same as the photomasks 100 and 200, except that each of light-shielding regions 114 of blind areas A includes a light-shielding film pattern 104a formed on a lower surface D of a transparent substrate 102, and a phase-shift layer pattern 106a formed at locations corresponding to the light-shielding film pattern 104a on an upper surface U of the transparent substrate 102.

If there is a difference between the reflectivity of the light-shielding film pattern 104a formed under the transparent substrate 102 and the reflectivity of the phase-shift layer pattern 106a, the light-shielding film pattern 104a may be formed in an entire region corresponding to the blind areas A. The photomask 300 may be manufactured by using the blankmask 30 described above with reference to FIG. 3, patterning the phase-shift layer 106, and further forming the light-shielding film pattern 104a under the transparent substrate 102, or may be manufactured by using the blankmask 40 described above with reference to FIG. 4 in which the phase-shift layer 106 and the light-shielding film 104 are formed on the upper surface U and lower surface D of the transparent substrate 102, respectively, and patterning the phase-shift layer 106 and the light-shielding film 104.

The light-shielding regions 114 of the blind areas A of each of the photomasks 100 and 200 according to the fifth and sixth embodiments include the light-shielding film pattern 104a and the phase-shift layer pattern 106a that are formed on the transparent substrate 102. In the photomask 100, the phase-shift layer pattern 106a is formed on the light-shielding film pattern 104a, whereas in the photomask 200, the light-shielding film pattern 104a is formed on the phase-shift layer pattern 106a. The light-shielding regions 114 included in the blind areas A of the photomask 300 according to the seventh embodiment each include the phase-shift layer pattern 106a formed on the upper surface U of the transparent substrate 102, and the light-shielding film pattern 104a formed at locations corresponding to the phase-shift layer pattern 106a on the lower surface D of the transparent substrate 102.

In the photomasks 100, 200, and 300 according to various embodiments of the present invention, the light-shielding regions 114 have an optical density of 2.0 to 4.0, and preferably, 1.5 to 3.0, with respect to exposure light. The light-shielding film pattern 104a is formed to secure the optical density of the light-shielding regions 114. To this end, the light-shielding film pattern 104a may have a thickness of 200 to 1,500, preferably, 300 to 1,000, and more preferably, 400 to 800. To secure the optical density of the light-shielding regions 114, the thicknesses of the light-shielding film pattern 104a and the phase-shift layer pattern 106a may be adjusted. Although not shown, an anti-reflective film pattern (e.g., the anti-reflective film pattern 105a of FIG. 1) may be formed on the light-shielding film pattern 104a. The anti-reflective film pattern may be formed of a material having the same etch features as or different etch features from the light-shielding film pattern 104a.

The phase-shift layer pattern 106a is formed at locations corresponding to the light-shielding film pattern 104a in the blind areas A, and on the transparent substrate 102 in the main area B. The phase-shift layer pattern 106a has a transmissivity of 0.1% to 40%, preferably, 0.1% to 20%, and more preferably, 0.1% to 6%, and has a reflectivity of 10% to 30%, at an exposure wavelength of 200 nm or less. The phase-shift layer pattern 106a has a thickness of 100 to 1,000, and preferably, 300 to 1,000, and has a phase reversal of 160° to 200°, and preferably, 170° to 190° at an exposure wavelength.

The light-shielding film pattern 104a may include at least one material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), and may further include at least one material selected from the group consisting of nitrogen (N), oxygen (O), and carbon (C). The phase-shift layer pattern 106a includes silicon (Si), and at least one metal material of the above materials of the light-shielding film pattern 104a. The phase-shift layer pattern 106a may further include at least one material selected from the group consisting of nitrogen (N), oxygen (O), and carbon (C).

The light-shielding film pattern 104a may be formed of, for example, a chromium-based compound, such as Cr, CrO, CrN, CrC, CrON, CrCN, CrCO, or CrCON, or may be formed of a 3-component metal compound, such as a MoTa-based compound including a tantalum-based compound and at least two types of metals. In order to have an etch selectivity with respect to the light-shielding film pattern 104a, the phase-shift layer pattern 106a may be formed of a metal-silicon compound, e.g., a MoSi-based compound including silicon (Si), such as MoSiO, MoSiN, MoSiC, MoSiCO, MoSiCN, MoSiON, or MoSiCON. However, the present invention is not limited thereto, and the materials used to form the light-shielding film pattern 104a and the materials used to form the phase-shift layer pattern 106a may be switched. Each of the light-shielding film pattern 104a and the phase-shift layer pattern 106a may have a single or multi-layer structure, and may be formed either in a single layer, the composition of which is uniform in a lengthwise direction or in a continuous layer, the composition of which varies in the lengthwise direction.

Figure 8:
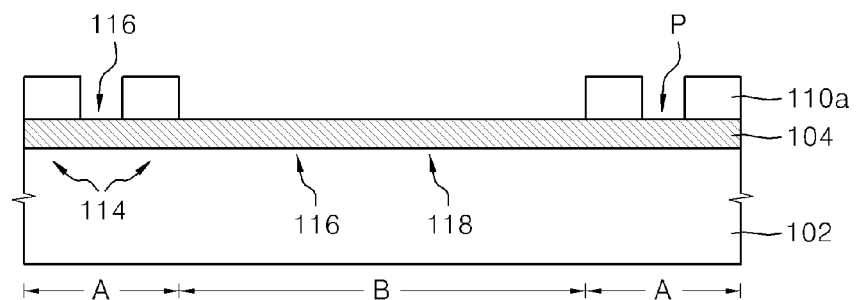
FIGS. 8 to 10 are cross-sectional views illustrating a method of manufacturing a photomask according to an embodiment of the present invention.
Figure 9:
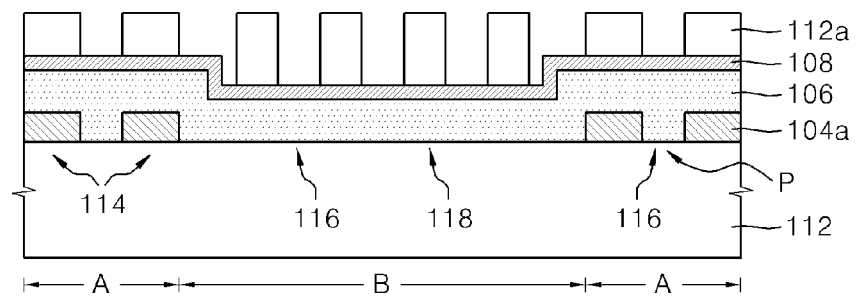
Figure 10:
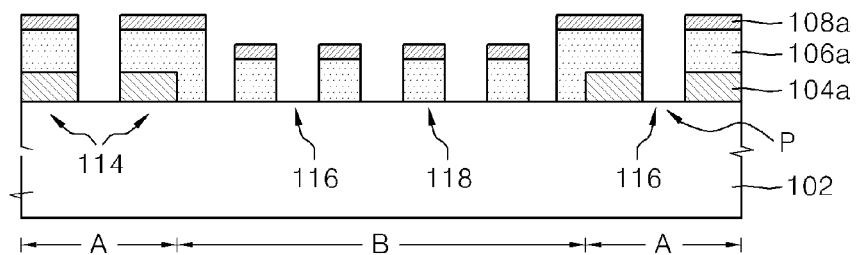

FIGS. 8 to 10 are cross-sectional views illustrating a method of manufacturing the photomask 100 according to the fifth embodiment of the present invention.

First, referring to FIG. 8, edge regions of a transparent substrate 102 are defined as blind areas A, and the remaining region of the transparent substrate 102 surrounded by the blind areas A is defined as a main area B. The blind areas A each include light-shielding regions 114 and a light-transmitting region 116. The light-transmitting regions 116 of the blind areas A are defined as auxiliary patterns, such as alignment keys P, which are included in the photomask. The main area B includes light-transmitting regions 116 and phase-shift regions 118.

A light-shielding film 104 is formed on the resultant transparent substrate 102. The light-shielding film 104 includes at least one material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), and may further include at least one material selected from the group consisting of nitrogen (N), oxygen (O), and carbon (C). The light-shielding film 104 may be formed of, for example, a chromium-based compound. The light-shielding film 104 may be formed to a thickness of 200 to 1,500, preferably, 300 to 1,000, and more preferably, 400 to 800. Although not shown, an anti-reflective film may be formed on the light-shielding film 104. The anti-reflective film may be formed of a material having the same etch features as or different etch features from the light-shielding film 104.

Then, a resist film (not shown) for patterning the light-shielding film 104 is formed on the light-shielding film 104, and a resist film pattern 110a for patterning the light-shielding film 104 is formed by patterning the resultant structure to expose light-transmitting regions 116 in the blind areas A and the light-shielding film 104 in the main area B.

Referring to FIG. 9, a light-shielding film pattern 104a is formed at locations on the transparent substrate 102 corresponding to the light-shielding regions 114 in the blind areas A by patterning the light-shielding film 104 using the resist film pattern 110a for patterning the light-shielding film 104 illustrated in FIG. 8 as an etch mask. The light-shielding film pattern 104a is formed not only to define the light-shielding regions 114 in the blind areas A but also to maintain the light-shielding regions 114 to have an optical density of to exposure light 2.0 to 4.0.

Then, the resist film pattern 110a for patterning the light-shielding film 104 is removed, a phase-shift layer 106 is formed to cover the light-shielding film pattern 104a and the exposed portions of the transparent substrate 102, and a hardmask film 108 and a resist film for patterning the hardmask film 108, e.g., the resist film 112 of FIG. 1, are sequentially formed on the phase-shift layer 106, thereby completing manufacture of a blankmask, such as the blankmask 10 illustrated in FIG. 1.

The hardmask film 108 includes at least one metal material selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), and may further include at least one material selected from the group consisting of nitrogen (N), oxygen (O), and carbon (C). The phase-shift layer 106 includes silicon (Si), and at least one metal material of the above materials of the hardmask film 108. The phase-shift layer 106 may further include at least one material selected from the group consisting of nitrogen (N), oxygen (O), and carbon (C). The hardmask film 108 and the phase-shift layer 106 are formed of materials having an etch selectivity to each other. In order to have etch selectivity with respect to the phase-shift layer 106, the hardmask film 108 may be formed of, for example, a chromium (Cr)-based compound, such as Cr, CrO, CrN, CrC, CrON, CrCN, CrCO, or CrCON, or may be formed of a 3-component metal compound, such as a MoTa-based compound including a tantalum-based compound and at least two types of metals. The hardmask film 108 is formed to a thickness of 10 to 100, and preferably, 20 to 50.

The phase-shift layer 106 is formed to a thickness of 100 to 1,000, and preferably, 300 to 900, and is formed to have a transmissivity of 0.1% to 40%, preferably, 0.1% to 20%, and more preferably, 0.1% to 6%. The phase-shift layer 106 is formed to have a phase reversal of 160° to 200°, and preferably, 170° to 190°, and is formed to have a reflectivity of 10% to 30%. Since the phase-shift layer 106 has a reflectivity of 10% to 30%, the phase-shift layer 106 may function as an anti-reflective film.

The resist film for patterning the hardmask film 108, e.g., the resist film 112 of FIG. 1, is formed of a material containing an acid, and is formed to a thickness of 300 to 2,000, and preferably, 400 to 1,500. In this case, the hardmask film 108 is used as an etch mask for etching the phase-shift layer 106 under the hardmask film 108. Thus, the resist film for patterning the hardmask film 108, e.g., the resist film 112 of FIG. 1, may also be formed to a thin thickness so as to pattern the hardmask film 108 to be thin.

Then, a resist film pattern 112a for patterning the hardmask film 108 is formed by patterning the resist film for patterning the hardmask film 108, e.g., the resist film 112 of FIG. 1, such that portions of the hardmask film 108 corresponding to the light-transmitting regions 116 are exposed in the blind areas A and the main area B.

Then, referring to FIG. 10, a hardmask film pattern 108a exposing portions of the phase-shift layer 106 corresponding to the light-transmitting regions 116 in the blind areas A and the main area B is formed by patterning the hardmask film 108 of FIG. 9 using the resist film pattern 112a for patterning the hardmask film 108 as an etch mask.

Then, a phase-shift layer pattern 106a exposing portions of the transparent substrate 102 corresponding to the light-transmitting regions 116 in the blind areas A and the main area B is formed by etching the phase-shift layer 106 of FIG. 9 using the hardmask film pattern 108a as an etch mask.

Thereafter, the photomask 100, such as that shown in FIG. 5, is finally manufactured by removing the hardmask film pattern 108a of FIG. 10. Since the hardmask film pattern 108a is used as an etch mask for etching the phase-shift layer 106 under the hardmask film pattern 108a, the resist film 112 for patterning the hardmask film 108 may be formed to a thin thickness. Also, since the phase-shift layer 106 is etched using the hardmask film pattern 108a having a high etch selectivity with respect to the phase-shift layer 106 as an etch mask, a pattern resolution of the photomask 100 may be increased, a loading effect may be reduced, and CD uniformity and linearity may be improved. Optionally, the hardmask film pattern 108a may remain on the phase-shift layer pattern 106a during the manufacture of the photomask 100.

If the phase-shift layer 106 is formed of a metal-silicon compound, such as a MoSi-based compound, then a problem caused when the phase-shift layer 106 does not have an etch selectivity with respect to the transparent substrate 102 may occur during patterning of the phase-shift layer 106. Thus, an etch stop layer (not shown) may be formed on the transparent substrate 102. To have an etch selectivity with respect to the phase-shift layer 106, the etch stop layer may be formed of a chromium (Cr)-based compound, such as Cr, CrO, CrN, CrC, CrON, CrCN, CrCO, or CrCON, or may be formed of a 3-component metal compound, such as a MoTa-based compound including a tantalum-based compound and at least two types of metals.

As described above, in the method of manufacturing the photomask 100 according to the present embodiment, the light-shielding film pattern 104a is formed at locations on the transparent substrate 102 corresponding to the light-shielding regions 114, the phase-shift layer 106 and the hardmask film 108 are formed, the resist film pattern 112a for patterning the hardmask film 108 is formed, the hardmask film pattern 108a is formed using the resist film pattern 112a for patterning the hardmask film 108 as an etch mask, and the exposed portions of the phase-shift layer 106 are etched using the hardmask film pattern 108a as an etch mask to obtain the phase-shift layer pattern 106a.

Figure 11:
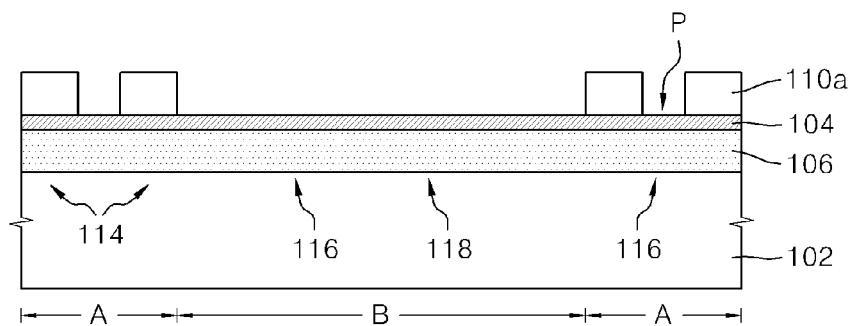
FIGS. 11 to 13 are cross-sectional views illustrating a method of manufacturing a photomask according to another embodiment of the present invention.
Figure 12:
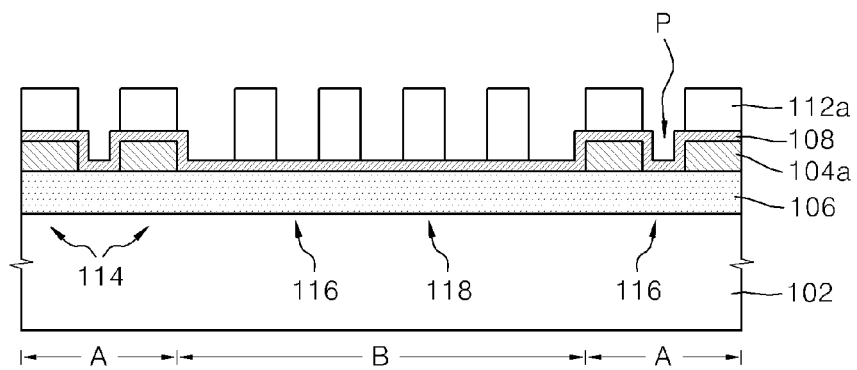
Figure 13:
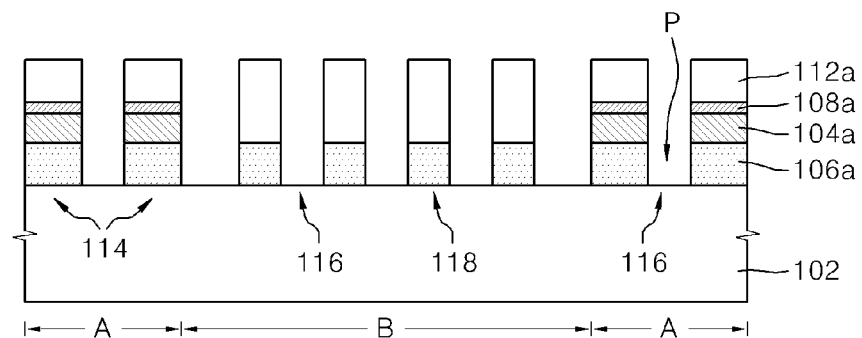

FIGS. 11 to 13 are cross-sectional views illustrating a method according to another embodiment of the present invention of manufacturing a photomask 200 according to the sixth embodiment.

First, referring to FIG. 11, edge regions of the transparent substrate 102 are defined as blind areas A, and the remnant region of the transparent substrate 102 surrounded by the blind areas A is defined as a main area B. The blind areas A each include light-shielding regions 114 and a light-transmitting region 116. The light-transmitting regions 116 of the blind areas A are defined as auxiliary patterns, such as alignment keys P, which are included in the photomask 200. The main area B includes light-transmitting regions 116 and phase-shift regions 118.

A phase-shift layer 106 is formed on the resultant transparent substrate 102, and a light-shielding film 104 is formed on the phase-shift layer 106. Although not shown, an anti-reflective film may be formed on the light-shielding film 104. The anti-reflective film may be formed of a material having the same etch features as or different etch features from the light-shielding film 104.

Then, a resist film (not shown) for patterning the light-shielding film 104 is formed on the light-shielding film 104, and is patterned to expose the light-transmitting regions 116 in the blind areas A and the light-shielding film 104 in the main area B, thereby forming a resist film pattern 110a for patterning the light-shielding film 104.

Referring to FIG. 12, a light-shielding film pattern 104a is formed at locations on the transparent substrate 102 corresponding to the light-shielding regions 114 in the blind areas A by patterning the light-shielding film 104 of FIG. 11 using the resist film pattern 110a for patterning the light-shielding film 104 illustrated in FIG. 11 as an etch mask. The light-shielding film pattern 104a is formed not only to define the light-shielding regions 114 in the blind areas A but also to maintain the light-shielding regions 114 to have an optical density to exposure light of 2.0 to 4.0.

Then, the resist film pattern 110a for patterning the light-shielding film 104 illustrated in FIG. 11 is removed, and a hardmask film 108 and a resist film (not shown) for patterning the hardmask film 108, e.g., the resist film 112 of FIG. 2, are sequentially formed on the phase-shift layer 106 to cover the light-shielding film pattern 104a and exposed portions of the phase-shift layer 106, thereby completing manufacture of the blankmask 20 of FIG. 2.

Then, a resist film pattern 112a for pattering the hardmask film 108 is formed by patterning the resist film for patterning the hardmask film 108, e.g., the resist film 112 of FIG. 2, such that portions of the hardmask film 108 corresponding to the light-transmitting regions 116 in the blind areas A and the main area B are exposed.

Then, referring to FIG. 13, a hardmask film pattern 108a exposing portions of the phase-shift layer 106 of FIG. 12 corresponding to the light-transmitting regions 116 in the blind areas A and the main area B is formed by patterning the hardmask film 108 of FIG. 12 using the resist film pattern 112a for pattering the hardmask film 108 as an etch mask. Then, a phase-shift layer pattern 106a exposing portions of the transparent substrate 102 corresponding to the light-transmitting regions 116 in the blind areas A and the main area B is formed by etching the phase-shift layer 106 of FIG. 12 using the hardmask film pattern 108a as an etch mask.

Then, the manufacture of the photomask 200 of FIG. 6 is completed by removing the hardmask film pattern 108a of the FIG. 13. Since the hardmask film pattern 108a is used as an etch mask for etching the phase-shift layer 106 under the hardmask film pattern 108a, the resist film 112 for patterning the hardmask film 108 may be formed to a thin thickness so as to pattern the hardmask film 108. By etching the phase-shift layer 106 using the hardmask film pattern 108a having a high etch selectivity with respect to the phase-shift layer 106, a pattern resolution of the photomask 200 may be increased, a loading effect may be reduced, and CD uniformity and linearity may be improved. Optionally, the hardmask film pattern 108a may remain on the phase-shift layer pattern 106a during the manufacture of the photomask 200.

As described above, in the method of manufacturing the photomask 200 according to the present embodiment, the phase-shift layer 106 is formed on the transparent substrate 102, the light-shielding film pattern 104a is formed at the locations on the transparent substrate 102 corresponding to the light-shielding regions 114, the hardmask film 108 is formed on the light-shielding film pattern 104a, a resist film pattern 112a for patterning the hardmask film 108 is formed, a hardmask film pattern 108a is formed using the resist film pattern 112a for patterning the hardmask film 108 as an etch mask, and the phase-shift layer pattern 106a is formed by etching the exposed portions of the phase-shift layer 106 using the hardmask film pattern 108a as an etch mask.

FIGS. 14 to 17 are cross-sectional views illustrating a method according to another embodiment of the present invention of manufacturing the photomask 200 according to the sixth embodiment.

Figure 14:
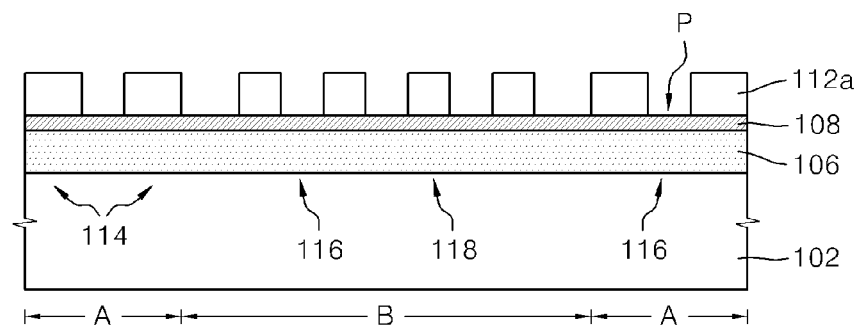
FIGS. 14 to 17 are cross-sectional views illustrating a method of manufacturing a photomask according to another embodiment of the present invention.

First, the blankmask 30 described above with reference to FIG. 3 is prepared, and a resist film pattern 112a for patterning a hardmask film 108 illustrated in FIG. 14 is formed by performing exposure and development on the resist film 112 for patterning the hardmask film 108, illustrated in FIG. 3. In the present embodiment, a transparent substrate 102 is defined to include blind areas A corresponding to edge regions of the transparent substrate 102 and each having light-shielding regions 114 and a light-transmitting region 116, and a main area B corresponding to the remaining region of the transparent substrate 102 surrounded by the blind areas A and having light-transmitting regions 116 and phase-shift regions 118. The resist film pattern 112a for patterning the hardmask film 108 is formed to expose portions of the hardmask film 108 corresponding to the light-transmitting regions 116 in the blind areas A and the main area B.

Figure 15:
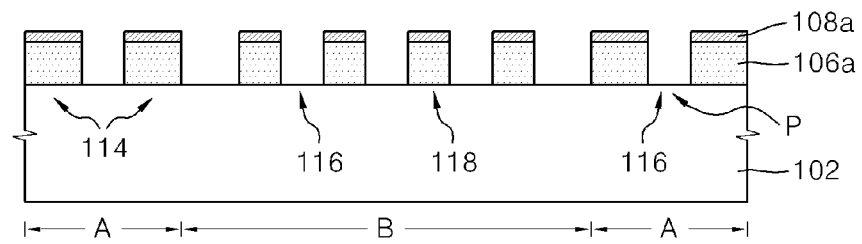

Referring to FIG. 15, a hardmask film pattern 108a exposing portions of the phase-shift layer 106 of FIG. 14 corresponding to the light-transmitting region 116 in the blind areas A and the main area B is formed by patterning the hardmask film 108 of FIG. 14 using the resist film pattern 112a for patterning the hardmask film 108 illustrated in FIG. 14 as an etch mask. Then, a phase-shift layer pattern 106a exposing portions of the transparent substrate 102 corresponding to the light-transmitting regions 116 in the blind areas A and the main area B is formed by etching the phase-shift layer 106 of FIG. 14 using the hardmask film pattern 108a as an etch mask.

Figure 16:
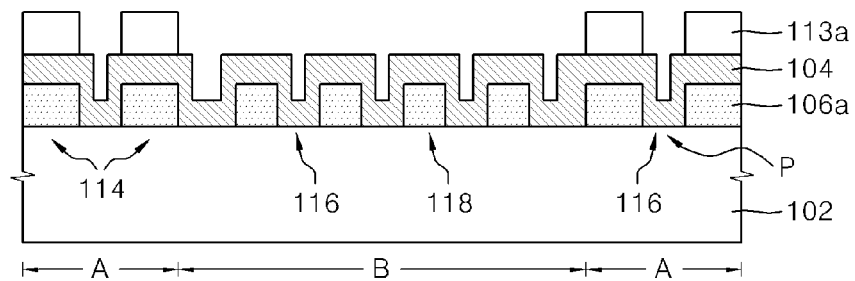

Referring to FIG. 16, the hardmask film pattern 108a of FIG. 15 is removed, a light-shielding film 104 is formed to cover the phase-shift layer pattern 106a and the exposed portions of the transparent substrate 102, and a resist film (not shown) for patterning the light-shielding film 104 is formed on the light-shielding film 104. Then, the resist film for patterning the light-shielding film 104 is patterned to form a resist film pattern 113a for patterning the light-shielding film 104 on portions of the light-shielding film 104 corresponding to the light-shielding regions 114 in the blind areas A.

Figure 17:
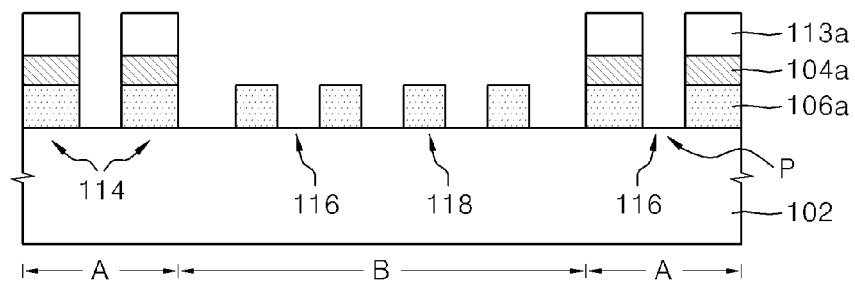

Referring to FIG. 17, a light-shielding film pattern 104a is formed by etching exposed portions of the light-shielding film 104 of FIG. 16 using the resist film pattern 113a for patterning the light-shielding film 104 as an etch mask. Then, the resist film pattern 113a for patterning the light-shielding film is removed to complete the manufacture of the photomask 200 as illustrated in FIG. 6, in which the phase-shift regions 118 including the phase-shift layer pattern 106a are formed in the main area B and the light-shielding regions 114, the optical density of which ranges from 2.0 to 4.0 with respect to exposure light, are formed in the blind areas A.

In the method of manufacturing the photomask 200 according to the present embodiment described above, the phase-shift layer 116 is formed on the transparent substrate 102, the hardmask film 108 is formed on the phase-shift layer 116, the resist film pattern 112a for patterning the hardmask film 108 is formed, the hardmask film pattern 108a is formed using the resist film pattern 112a for patterning the hardmask film 108 as an etch mask, the phase-shift layer pattern 106a is formed by etching the exposed portions of the phase-shift layer 106 using the hardmask film pattern 108a as an etch mask, and the light-shielding film pattern 104a is formed at the locations on the transparent substrate 102 corresponding to the light-shielding regions 114.

In the blankmask 30 used to manufacture the photomask 200 according to the sixth embodiment, the light-shielding film 104 is not present and only the hardmask film 108 is present on the phase-shift layer 106, as described above with reference to FIG. 3. Thus, the blankmask 30 may be used to manufacture the photomask 200 by controlling an optical density and a transmissivity of the photomask 200 using only the phase-shift layer 106 and the hardmask film 108.

Furthermore, the photomask 200 according to the sixth embodiment may also be manufactured using a lift-off method to be described with reference to FIG. 18 below.

First, by performing the processes described above with reference to FIGS. 14 and 15, a hardmask film pattern 108a exposing portions of a phase-shift layer 106 corresponding to light-transmitting regions 116 in blind areas A and a main area B is formed, and a phase-shift layer pattern 106a exposing portions of a transparent substrate 102 corresponding to the light-transmitting regions 116 in the blind areas A and the main area B is formed by etching the phase-shift layer 106 using the hardmask film pattern 108a as an etch mask.

Figure 18:
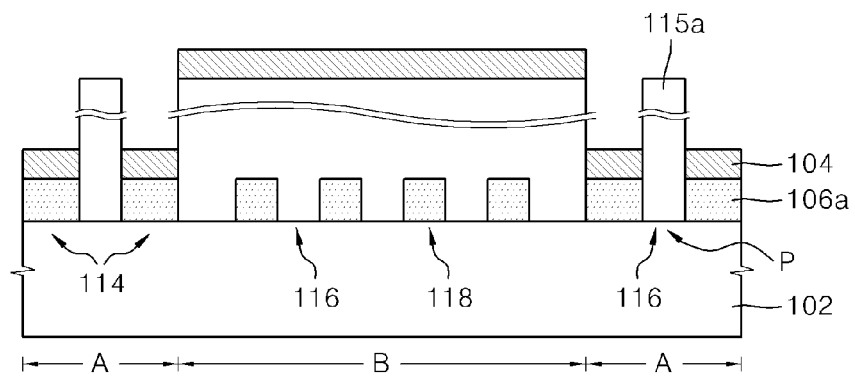
FIG. 18 is a cross-sectional view illustrating a method of manufacturing a photomask according to another embodiment of the present invention.

Then, referring to FIG. 18, a resist film (not shown) for lifting off is formed in all of the blind areas A and the main area B, and a resist film pattern 115a for lifting off is formed by patterning the resist film for lifting off, such that the exposed portions of the transparent substrate 102 in the blind areas A and the phase-shift layer pattern 106a and the exposed portions of the transparent substrate 102 in the main area B are covered with the resist film pattern 115a. Then, a light-shielding film 104 is formed on the phase-shift layer pattern 106a in the blind areas A and the resist film pattern 115a for lifting off, in the main area B.

Thereafter, the photomask 200 according to the sixth embodiment may be obtained by removing the resist film pattern 115a for lifting off and the light-shielding film 104 on the resist film pattern 115a for lifting off, according to the lift-off method.

Similarly, in the method of manufacturing the photomask 200 according to the present embodiment, the phase-shift layer 106 is formed on the transparent substrate 102, a hardmask film 108 is formed on the phase-shift layer 106, a resist film pattern 112a for patterning the hardmask film 108 is formed, the hardmask film pattern 108a is formed using the resist film pattern 112a for patterning the hardmask film 108 as an etch mask, the phase-shift layer pattern 106a is formed by etching exposed portions of the phase-shift layer 106 using the hardmask film pattern 108a as an etch mask, and a light-shielding film pattern 104a is formed at locations of the transparent substrate 102 corresponding to light-shielding regions 114.

As described above, since a hardmask film pattern is used as an etch mask for etching a phase-shift layer during manufacture of a photomask according to an embodiment of the present invention, a resist film for patterning the hardmask film may be formed to a thin thickness. Thus, since the phase-shift layer is etched using the hardmask film having a high etch selectivity with respect to the phase-shift layer as an etch mask, an optical density of the photomask may be maintained to be about 3.0 due to a light-shielding film. Accordingly, it is possible to manufacture a photomask in which pattern resolution is high, a loading effect is reduced, and CD features, e.g., CD uniformity and CD linearity, are improved.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

INDUSTRIAL APPLICABILITY

Accordingly, the photomask may be applied to 193 nm ArF lithography, immersion lithography, and the like.

The invention claimed is:

1. A blankmask comprising:
   a transparent substrate;
   a light-shielding film pattern formed on an upper surface of the transparent substrate, so that edge regions of the transparent substrate are defined as blind areas and a main area surrounded by the blind areas is defined;
   a phase-shift layer formed on the upper surface of the transparent substrate; and
   a hardmask film formed on the light-shielding film pattern and the phase-shift layer and covering the blind areas and the main area.

2. The blankmask of claim 1, wherein the phase-shift layer is formed to cover the light-shielding film pattern.

3. The blankmask of claim 1, wherein the light-shielding film pattern is formed on the phase-shift layer.

4. The blankmask of claim 1, wherein each of the phase-shift layer and the hardmask film has a single or multi-layer form, and is formed in either a single layer, the composition of which is uniform in a depthwise direction thereof, or in a continuous layer, the composition of which varies in the depthwise direction.

5. The blankmask of claim 1, wherein the blind areas each have an optical density of 2.0 to 4.0 with respect to an exposure wavelength.

6. The blankmask of claim 1, wherein the light-shielding film pattern has a single or multi-layer form, and is formed in either a single layer, the composition of which is uniform in a depthwise direction thereof, or in a continuous layer, the composition of which varies in the depthwise direction.

7. The blankmask of claim 1, further comprising an anti-reflective film pattern formed on the light-shielding film pattern.

8. The blankmask of claim 1, wherein the hardmask film has a thickness of 10 Å to 100 Å.

9. The blankmask of claim 1, wherein the phase-shift layer comprises silicon (Si), and at least one metal material selected from the group consisting of titanium, vanadium, cobalt, nickel, zirconium, niobium, palladium, zinc, chromium, aluminum, manganese, cadmium, magnesium, lithium, selenium, copper, molybdenum, hafnium, tantalum, and tungsten, and optionally comprises at least one material selected from the group consisting of nitrogen, oxygen, and carbon.

10. A photomask in which a transparent substrate is defined to include blind areas each including light-shielding regions and a light-transmitting region and a main area including phase-shift regions and light-transmitting regions,
wherein the light-transmitting regions are regions via which the transparent substrate is exposed, the phase-shift regions are regions in which a phase-shift layer pattern is formed in the main area of the transparent substrate, and the light-shielding regions are regions in which a light-shielding film pattern and a phase-shift layer pattern are formed in the blind areas of the transparent substrate such that the light-shielding film pattern is disposed between the transparent substrate and the phase-shift layer pattern, and
wherein the light-shielding film pattern has a thickness of 200 Å to 1,500 Å so that the light-shielding regions each have an optical density of 2.0 to 4.0 with respect to exposure light.

11. A method of manufacturing a photomask including a transparent substrate including blind areas each including light-shielding regions and a light-transmitting region and a main area including phase-shift regions and light-transmitting regions, the method comprising the steps:
  (a) forming a light-shielding film pattern at locations corresponding to the light-shielding regions on an upper surface of the transparent substrate;
  (b) forming a phase-shift layer on the upper surface of the transparent substrate;
  (c) forming a hardmask film on the phase-shift layer;
  (d) forming a resist film pattern for patterning the hardmask film on the hardmask film to expose portions of the hardmask film corresponding to the light-transmitting regions;
  (e) forming a hardmask film pattern by etching the exposed portions of the hardmask film using the resist film pattern for patterning the hardmask film as an etch mask; and
  (f) forming a phase-shift layer pattern in the phase-shift regions by etching exposed portions of the phase-shift layer using the hardmask film pattern as an etch mask,
  wherein the steps are performed in the order:
    (A): (a), (b), (c), (d), (e), (f), or
    (B): (b), (a), (c), (d), (e), (f), or
    (C): (b), (c), (d), (e), (f), (a).

12. The method of claim 11, wherein in alternative (C), during the performing of (a), patterning or a lift-off method using a resist film is used.

13. The method of claim 11, after the performing of (f), further comprising removing the hardmask film pattern.

* * * * *